US012330888B2

(12) United States Patent
Shindo et al.

(10) Patent No.: US 12,330,888 B2
(45) Date of Patent: Jun. 17, 2025

(54) SUBSTRATE TRANSFER DEVICE AND METHOD OF COOLING ARM

(71) Applicant: Tokyo Electron Limited, Tokyo (JP)

(72) Inventors: Takehiro Shindo, Nirasaki (JP); Wataru Matsumoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 529 days.

(21) Appl. No.: 17/721,768

(22) Filed: Apr. 15, 2022

(65) Prior Publication Data
US 2022/0340377 A1 Oct. 27, 2022

(30) Foreign Application Priority Data

Apr. 23, 2021 (JP) ................................ 2021-073007

(51) Int. Cl.
B65G 47/90 (2006.01)
B25J 19/00 (2006.01)
B65G 69/20 (2006.01)
H01L 21/67 (2006.01)

(52) U.S. Cl.
CPC .......... B65G 47/90 (2013.01); B25J 19/0054 (2013.01); B65G 69/20 (2013.01); H01L 21/67109 (2013.01); H01L 21/67248 (2013.01)

(58) Field of Classification Search
CPC ...... B65G 47/90; B65G 69/20; B25J 19/0054; B25J 9/06; B25J 9/1653; B25J 11/0095; B25J 13/087; B25J 13/088; H01L 21/677; H01L 21/67109; H01L 21/67248; H01L 21/67742; H01L 21/68707; F25D 29/00; F25D 31/00; F25D 2600/06

See application file for complete search history.

(56) References Cited

U.S. PATENT DOCUMENTS

| 5,185,512 | A | * | 2/1993 | Torii | B23K 26/0884 |
| | | | | | 219/121.84 |
| 8,326,468 | B2 | * | 12/2012 | Kondoh | H01L 21/67766 |
| | | | | | 414/935 |
| 9,025,126 | B2 | * | 5/2015 | Shirata | G03F 7/70858 |
| | | | | | 355/72 |
| 10,569,430 | B2 | * | 2/2020 | Hosek | H01L 21/67259 |

(Continued)

FOREIGN PATENT DOCUMENTS

WO 2015037701 A1 3/2015

Primary Examiner — M. N. Von Buhr
(74) Attorney, Agent, or Firm — Nath, Goldberg & Meyer; Jerald L. Meyer; Tanya E. Harkins

(57) ABSTRACT

A substrate transfer device that transfers a substrate, includes: a transfer arm including a substrate support and an arm; a cooler configured to distribute and supply a cooling fluid from a fluid supply source to each of cooling target regions of the arm; a measuring part configured to measure a temperature of each of the cooling target regions; and a controller. The controller is configured to: calculate a thermal index for each of the cooling target regions based on the amount of change of the temperature of the cooling target region measured by the measuring part from a reference temperature and a degree of influence of the temperature of the cooling target region affecting a movement accuracy of the substrate support; and determine a distribution ratio of the cooling fluid from the fluid supply source by the cooler based on the thermal index.

16 Claims, 6 Drawing Sheets

(56) References Cited

U.S. PATENT DOCUMENTS

| | | | |
|---|---|---|---|
| 11,045,944 B2* | 6/2021 | Phipps | G01B 21/045 |
| 11,440,206 B2* | 9/2022 | Tanaka | B25J 19/02 |
| 11,890,753 B2* | 2/2024 | Nodo | H02K 9/19 |
| 2022/0037181 A1* | 2/2022 | Hatano | H01L 21/67742 |

* cited by examiner

SUBSTRATE TRANSFER DEVICE AND METHOD OF COOLING ARM

CROSS-REFERENCE TO RELATED APPLICATION

This application is based upon and claims the benefit of priority from Japanese Patent Application No. 2021-073007, filed on Apr. 23, 2021, the entire contents of which are incorporated herein by reference.

TECHNICAL FIELD

The present disclosure relates to a substrate transfer device and a method of cooling an arm.

BACKGROUND

Patent Document 1 discloses an industrial robot that transfers a transfer object in vacuum. This industrial robot includes a hand on which the transfer object is mounted, an arm formed in a hollow shape and to which the hand is connected to the leading end side, and a cooler for cooling the inside of the arm. The hand and the arm are arranged in vacuum, and the arm includes arm portions that are formed in a hollow shape and are connected to each other so as to be relatively rotatable. The inside of the arm portions has the atmospheric pressure. A temperature sensor for measuring the temperature of the inside of the arm portion is arranged inside each of the arm portions. The cooler is provided with a cooling air supply port arranged inside each of the arm portions and adjusts the amount of supply of the cooling air from the supply port based on a detection result of the temperature sensor, so that the inside of each of the arm portions is cooled individually.

PRIOR ART DOCUMENTS

Patent Document

International Application Publication No. 2015-37701

SUMMARY

According to one embodiment of the present disclosure, there is provided a substrate transfer device that transfers a substrate. The substrate transfer device includes: a transfer arm including a substrate support that supports the substrate, and an arm that is connected to the substrate support and moves the substrate support; a cooler configured to distribute and supply a cooling fluid from a fluid supply source to each of a plurality of cooling target regions of the arm; a measuring part configured to measure a temperature of each of the cooling target regions; and a controller. The controller is configured to: calculate a thermal index for each of the cooling target regions based on the amount of change of the temperature of the cooling target region measured by the measuring part from a reference temperature and a degree of influence of the temperature of the cooling target region affecting a movement accuracy of the substrate support; and determine a distribution ratio of the cooling fluid from the fluid supply source by the cooler based on the thermal index.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
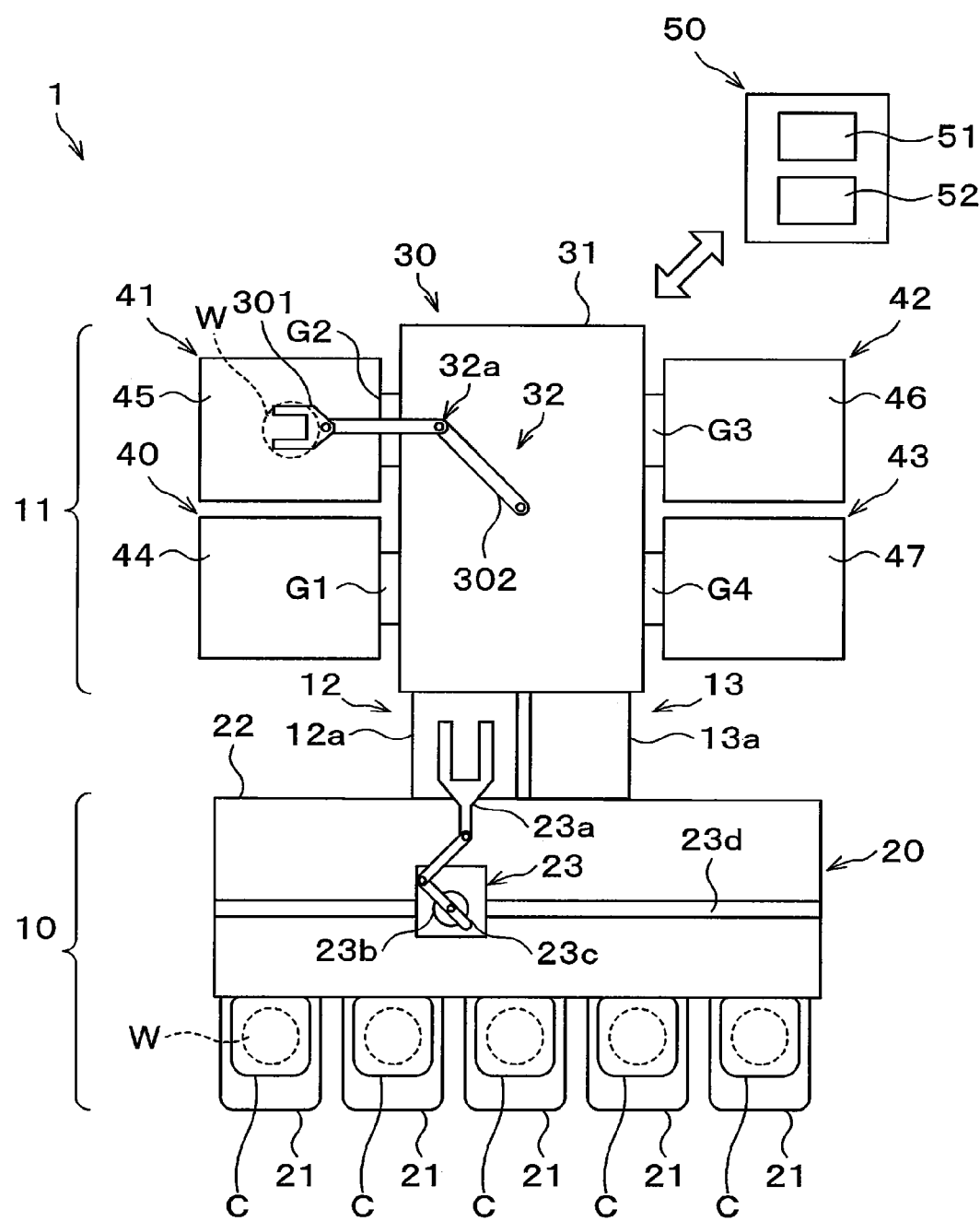
FIG. 1 is a plane view showing the outline of the configuration of a wafer processing system including a vacuum transfer device as a substrate transfer device according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a process of manufacturing a semiconductor device or the like, a predetermined process such as a film forming process or an etching process is performed on a substrate such as a semiconductor wafer (hereinafter, referred to as a "wafer") by a substrate processing apparatus. The above-mentioned process is performed by a processing apparatus having a mounting table on which a substrate is mounted, and a substrate transfer device is used for loading/unloading the substrate into/from the processing apparatus.

The substrate transfer device includes a substrate support such as a fork that supports the substrate, and a transfer arm having an arm that is connected to the fork and moves the fork. The transfer arm is, for example, an articulated arm and can move the fork by bending and stretching.

As a processing result by the processing apparatus, in order to obtain an appropriate processing result such as a uniform processing result on the substrate surface, it is necessary to accurately align and mount the substrate on the mounting table. For that purpose, it is necessary to move the fork accurately with respect to the mounting table.

In addition, the substrate transfer device may transfer a hot substrate. In this case, a drive mechanism that drives the movement of the fork, that is, the bending and stretching of the transfer arm, is heated by radiant heat from the hot substrate. As a result, the movement accuracy of the fork may decrease. For example, the degree of engagement of gears of the drive mechanism may change depending on a temperature. As a result, the movement accuracy of the fork may decrease.

Further, it is required to move the fork at a high speed to process the substrate with a high throughput. However, when the fork is moved at the high speed, a motor which is a drive source for the movement of the fork of the drive mechanism generates heat by which the gears are heated, which may decrease the movement accuracy of the fork.

There are multiple places in the arm where a temperature change affects the movement accuracy of the fork. As a method for suppressing a decrease in the movement accuracy of the fork, a method of measuring the temperature of each of the above-mentioned multiple places and supplying cooling air at a flow rate corresponding to the measurement result to each of the multiple places to cool the fork may be considered. However, in this method, if the maximum total flow rate of the cooling air is limited in order to reduce the cost, that is, to save energy, the cooling cannot be sufficiently performed, which may decrease the movement accuracy of the fork. In other words, this method has room for improvement in terms of the efficiency of cooling the arm.

Therefore, the technique according to the present disclosure efficiently cools the arm in the substrate transfer device to suppress the decrease in the movement accuracy of the substrate support.

Hereinafter, a substrate transfer device and a method of cooling an arm according to an embodiment will be described with reference to the drawings. Throughout the present disclosure and the drawings, elements having substantially the same functional configurations are denoted by the same reference numerals, and explanation thereof will not be repeated.

<Wafer Processing System>

FIG. 1 is a plane view showing the outline of the configuration of a wafer processing system 1 including a vacuum transfer device as a substrate transfer device according to the present embodiment.

The wafer processing system 1 of FIG. 1 performs predetermined processes such as a film forming process, a diffusion process, and an etching process on a wafer W as a substrate under a reduced pressure. The wafer processing system 1 has a configuration in which a carrier station 10 into/from which a carrier C capable of accommodating wafers W is loaded/unloaded and a processing station 11 provided with various processing apparatuses for performing the above-mentioned predetermined processes on the wafer W under the reduced pressure are integrally connected. The carrier station 10 and the processing station 11 are connected via two load lock devices 12 and 13.

The load lock devices 12 and 13 have load lock chambers 12a and 13a configured to switch their interiors between an atmospheric pressure state and a vacuum state, respectively. The load lock devices 12 and 13 are provided so as to connect an atmospheric pressure transfer device 20 to be described later and a vacuum transfer device 30 to be described later as a substrate transfer device.

The carrier station 10 has the atmospheric pressure transfer device 20 and a carrier mounting table 21. The carrier station 10 may be further provided with an aligner (not shown) for adjusting the orientation of the wafer W.

The atmospheric pressure transfer device 20 has an atmosphere transfer chamber 22 whose interior is under an atmospheric pressure. The atmosphere transfer chamber 22 is connected to the load lock chambers 12a and 13a of the load lock devices 12 and 13 via a gate valve (not shown). A transfer mechanism 23 is provided in the atmosphere transfer chamber 22. The transfer mechanism 23 is configured to be able to transfer the wafer W to/from the load lock chambers 12a and 13a under the atmospheric pressure.

The transfer mechanism 23 has a transfer arm 23a that supports the wafer W at the time of transfer, a rotary table 23b that rotatably supports the transfer arm 23a, and a base 23c on which the rotary table 23b is mounted. Further, a guide rail 23d extending in the longitudinal direction of the atmosphere transfer chamber 22 is provided inside the atmosphere transfer chamber 22. The base 23c is provided on the guide rail 23d, and the transfer mechanism 23 is configured to be movable along the guide rail 23d.

The carrier mounting table 21 is provided on the opposite side surface of the load lock devices 12 and 13 in the atmospheric pressure transfer device 20. In the shown example, carriers C, for example, five carriers, can be mounted on the carrier mounting table 21. The wafers W in the carrier C mounted on the carrier mounting table 21 are loaded/unloaded into/from the atmosphere transfer chamber 22 by the transfer arm 23a of the transfer mechanism 23 of the atmospheric pressure transfer device 20.

The processing station 11 has the vacuum transfer device 30 and processing apparatuses 40 to 43.

The vacuum transfer device 30 has a vacuum transfer chamber 31 whose interior is kept in a decompressed state (vacuum state). The vacuum transfer chamber 31 is connected to the load lock chambers 12a and 13a of the load lock devices 12 and 13 via a gate valve (not shown). Further, the vacuum transfer chamber 31 is connected to vacuum process chambers 44 to 47 to be described later via gate valves G1 to G4, respectively. A wafer transfer mechanism 32 as a substrate transfer mechanism for transferring the wafer W is provided in the vacuum transfer chamber 31. The wafer transfer mechanism 32 loads/unloads the wafer W into/from the processing apparatuses 40 to 43. The wafer transfer mechanism 32 includes a transfer arm 32a having a fork 301 as a substrate support, and an arm 302. The fork 301 supports the wafer W. The arm 302 is connected to the fork 301 and moves the fork 301. The details of the configuration of the wafer transfer mechanism 32 will be described later.

The processing apparatuses 40 to 43 perform predetermined processes such as a film forming process, a diffusion process, and an etching process on the wafer W under a reduced pressure. Further, the processing apparatuses 40 to 43 have the vacuum process chambers 44 to 47 in which the predetermined processes are performed on the wafer W under the reduced pressure, respectively.

Further, the wafer processing system 1 includes a control device 50. The control device 50 has a controller 51 and a display 52.

The controller 51 includes a computer equipped with a processor such as a CPU, and a memory, and has a storage part (not shown) for storing various pieces of information. The storage part stores a program for controlling the wafer processing in the wafer processing system 1 and a program for controlling the cooling process of the arm 302. The above-mentioned programs have been recorded on a computer-readable storage medium and may be installed on the controller 51 from the storage medium. Further, the storage medium may be transitory or non-transitory. Part or all of the programs may be realized by dedicated hardware (circuit substrate).

The display 52 displays various pieces of information and is composed of a display device such as a liquid crystal display or an organic display.

<Wafer Processing>

Next, an example of the wafer processing performed using the wafer processing system 1 configured as described above will be described. The following process is performed under the control of the controller 51.

First, the wafer W is taken out from the carrier C by the transfer arm 23a of the transfer mechanism 23, and a gate valve (not shown) on the atmosphere side with respect to the load lock device 12 is opened. After that, the wafer W is loaded into the load lock device 12 by the transfer arm 23a and is loaded into the load lock device 12.

Subsequently, the gate valve is closed, and the inside of the load lock device 12 is sealed to reduce the internal pressure thereof.

When the internal pressure of the load lock device 12 becomes equal to or lower than a predetermined pressure, a gate valve (not shown) on the vacuum atmosphere side is opened, and the wafer W is received by the transfer arm 32a of the wafer transfer mechanism 32 from the inside of the load lock device 12, taken out from the load lock device 12, and loaded into the vacuum transfer chamber 31.

Next, after the gate valve is closed, a gate valve for a processing apparatus that performs a target process (here, the gate valve G1 for the processing apparatus 40) is opened. Subsequently, the wafer W is loaded into the processing apparatus 40 by the transfer arm 32a. After that, the gate valve G1 is closed, and a desired process is performed on the wafer W in the processing apparatus 40.

After the desired process is completed, the gate valve G1 is opened, and the wafer W in the processing apparatus 40 is unloaded by the transfer arm 32a of the wafer transfer mechanism 32. Then, the wafer W is unloaded from the vacuum transfer chamber 31 in the reverse procedure of loading the wafer W into the vacuum transfer chamber 31, and a series of wafer processing is completed.

<Wafer Transfer Mechanism>

Figure 2:
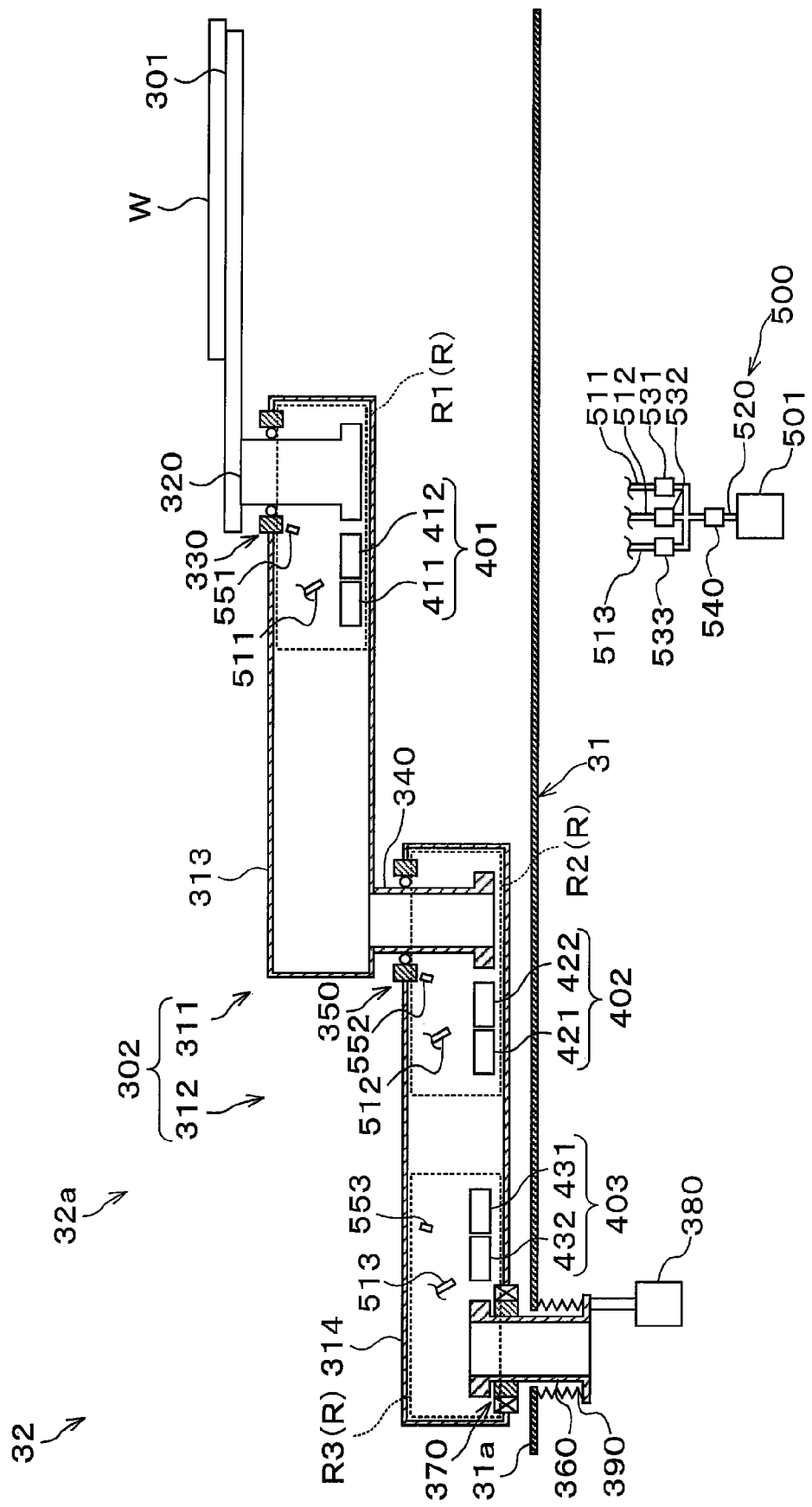
FIG. 2 is a longitudinal sectional view schematically showing a configuration example of a wafer transfer mechanism.

Next, an example of the wafer transfer mechanism 32 will be described with reference to FIG. 2. FIG. 2 is a longitudinal sectional view schematically showing a configuration example of the wafer transfer mechanism 32.

As shown in FIG. 2, the wafer transfer mechanism 32 has the transfer arm 32a. The number of transfer arms 32a included in the wafer transfer mechanism 32 is one in this example, but there may be plural transfer arms 32a. The transfer arm 32a is, for example, an articulated arm. As described above, the transfer arm 32a has the fork 301 that supports the wafer W, and the arm 302 that is connected to the fork 301 and moves the fork 301.

The arm 302 has, for example, a first arm 311 and a second arm 312. The first arm 311 and the second arm 312 have rectangular parallelepiped housings 313 and 314, respectively. Each of the housings 313 and 314 is formed to be hollow, and the inside thereof has a non-vacuum atmosphere.

The fork 301 holds the wafer W on the leading end side thereof. The fork 301 is connected to a leading end side of the first arm 311 so as to be rotatable horizontally with a base end side of the fork 301 as an axis. Specifically, a columnar shaft portion 320 as a joint shaft is provided so as to extend vertically downward from the lower surface of the base end side of the fork 301, and the shaft portion 320 is rotatably connected to the leading end side of the first arm 311. The leading end side of the shaft portion 320 is inserted inside the housing 313 of the first arm 311. Plural forks 301 may be provided for the first arm 311.

A seal mechanism 330 is provided on the upper portion of the first arm 311 on the leading end side to seal air-tightly between the shaft portion 320 of the fork 301 and the housing 313 and to rotatably support the shaft portion 320. The seal mechanism 330 has, for example, a seal member made of resin.

The first arm 311 is rotatably connected to the leading end side of the second arm 312 with the base end side of the first arm 311 as an axis. Specifically, a cylindrical shaft portion 340 as a joint shaft is provided so as to extend vertically downward from the lower surface of the base end side of the housing 313 of the first arm 311, and the shaft portion 340 is rotatably connected to the leading end side of the second arm 312a. The leading end side of the shaft portion 340 is connected to the inside of the housing 314 of the second arm 312. The inside of the housing 313 of the first arm 311 and the inside of the housing 314 of the second arm 312 communicate with each other via a hollow portion of the cylindrical shaft portion 340.

A seal mechanism 350 is provided on the upper portion of the second arm 312 on the leading end side to seal air-tightly between the shaft portion 340 of the first arm 311 and the housing 314 and to rotatably support the shaft portion 340. The seal mechanism 350 has, for example, a seal member made of resin.

The second arm 312 is rotatably connected to a cylindrical elevating shaft 360 with the base end side of the second arm 312 as an axis. Specifically, the cylindrical elevating shaft 360 as a joint shaft is provided so as to penetrate a bottom wall of the housing 314 of the second arm 312, and the housing 314 is configured to be able to rotate around the elevating shaft 360. The base end side of the elevating shaft 360 is located inside the housing 314 of the second arm 312, and the leading end side of the elevating shaft 360 penetrates a bottom wall 31a of the vacuum transfer chamber 31.

Further, a seal mechanism 370 that air-tightly closes between the leading end side of the elevating shaft 360 and the housing 314 and supports the housing 314 on the elevating shaft 360 is provided in the lower portion of the second arm 312 on the base end side. The seal mechanism 370 has, for example, a magnetic fluid seal.

The elevating shaft 360 is provided with a drive mechanism 380 that drives the raising/lowering of the elevating shaft 360. The drive mechanism 380 has a drive source such as a motor that generates a driving force for raising/lowering the elevating shaft 360. As the elevating shaft 360 is raised/lowered, the second arm 312 is raised/lowered, and the transfer arm 32a is raised/lowered. A bellows 390 is provided to air-tightly close between the elevating shaft 360 and the bottom wall 31a of the vacuum transfer chamber 31. Further, the inside of the housing 314 of the second arm 312 and the outside of the vacuum transfer chamber 31 in a non-vacuum atmosphere (for example, an air atmosphere) communicate with each other via a hollow portion of the cylindrical elevating shaft 360.

Further, the transfer arm 32a includes drive mechanisms 401 to 403 that drive the bending and stretching of the transfer arm 32a by driving the relative rotation between portions connected via a joint shaft such as the shaft portion 340. The drive mechanism 401 is provided inside the housing 313 of the first arm 311, and the drive mechanisms 402 and 403 are provided inside the housing 314 of the second arm 312.

Specifically, the drive mechanism 401 drives the rotation of the fork 301. More specifically, the drive mechanism 401 drives the rotation of the shaft portion 320 provided on the fork 301. The drive mechanism 401 includes a motor 411 that generates a driving force for rotation of the shaft portion 320, and a gear unit 412 having gears that transmit the driving force of the motor 411 to the shaft portion 320. The gear unit 412 and the shaft portion 320 are connected to each other via, for example, a timing belt (not shown).

The drive mechanism 402 drives the rotation of the first arm 311. More specifically, the drive mechanism 402 drives the rotation of the shaft portion 340 provided on the first arm 311. The drive mechanism 402 includes a motor 421 that generates a driving force for the rotation of the shaft portion 340, and a gear unit 422 having gears that transmit the driving force of the motor 421 to the shaft portion 340. The gear unit 422 and the shaft portion 340 are connected to each other via, for example, a timing belt (not shown).

Specifically, the drive mechanism 403 drives the rotation of the second arm 312. More specifically, the drive mechanism 403 drives the rotation of the second arm 312 around the elevating shaft 360. The drive mechanism 403 includes a motor 431 that generates a driving force for the rotation of the second arm 312, and a gear unit 432 having gears that transmit the driving force of the motor 431 to the elevating shaft 360. The gear unit 432 and the elevating shaft 360 are connected via, for example, a timing belt (not shown).

The motors 411, 421 and 431 are controlled by the controller 51.

Further, m (m is a natural number of 2 or more, in this example, m=3) cooling target regions R, that is, plural cooling target regions R, are set for the arm 302 of the transfer arm 32a. The drive mechanism 401 is provided in a cooling target region R1 and faces the seal mechanism 330. The drive mechanism 402 is provided in a cooling target region R2 and faces the seal mechanism 350. The drive mechanism 403 is provided in a cooling target region R3 and faces the seal mechanism 370.

Further, the wafer transfer mechanism 32 has a cooler 500 capable of individually cooling each of the cooling target regions R. The cooler 500 distributes and supplies a compressed gas as a cooling fluid from a compressed gas source 501 as a fluid supply source to each of the cooling target regions R.

The cooler 500 has distribution pipes 511 to 513 each provided with an injection port of the compressed gas source 501 on the leading end side for each cooling target region R.

The drive mechanism 401 and the seal mechanism 330 are cooled by the compressed gas injected from the injection port of the distribution pipe 511. The distribution pipe 511 is provided to directly spray the compressed gas from the injection port, for example, on the gear unit 412 which has the greatest influence on the movement accuracy of the fork 301 (that is, the transfer accuracy of the wafer W) in the cooling target region R1.

The drive mechanism 402 and the seal mechanism 350 are cooled by the compressed gas injected from the injection port of the distribution pipe 512. The distribution pipe 512 is provided to directly spray the compressed gas from the injection port, for example, on the gear unit 422 which has the greatest influence on the movement accuracy of the fork 301 in the cooling target region R2.

The drive mechanism 403 and the seal mechanism 370 are cooled by the compressed gas injected from the injection port of the distribution pipe 513. The distribution pipe 513 is provided to directly spray the compressed gas from the injection port, for example, on the gear unit 432 which has the greatest influence on the movement accuracy of the fork 301 in the cooling target region R3.

The compressed gas injected from the distribution pipes 511 to 513 passes through the inside of the arm 302 and is discharged to the non-vacuum atmosphere outside the vacuum transfer chamber 31 through the hollow portion of the elevating shaft 360.

Further, the base end sides of the distribution pipes 511 to 513 merge and are connected to the leading end of a main pipe 520. The base end of the main pipe 520 is connected to the compressed gas source 501.

As will be described later, the controller 51 determines the distribution ratio of the cooling fluid. Flow rate adjusting device groups 531 to 533 are provided in the distribution pipes 511 to 513, respectively, so that the cooler 500 can distribute and supply the compressed gas from the compressed gas source 501 to each of the cooling target regions R1 to R3 at the distribution ratio of the cooling fluid determined by the controller 51. The flow rate adjusting device groups 531 to 533 each include, for example, a flow rate adjusting valve (not shown) for adjusting a flow rate, an opening/closing valve (not shown) for switching supply/stop of the compressed fluid, and so on.

The main pipe 520 is provided with an opening/closing valve 540 for switching the supply/stop of the compressed fluid to the distribution pipes 511 to 513. The flow rate adjusting device groups 531 to 533 and the opening/closing valve 540 are controlled by the controller 51.

Further, the wafer transfer mechanism 32 has temperature sensors 551 to 553 as a measuring part for measuring the temperatures of the cooling target regions R1 to R3, respectively. Specifically, the wafer transfer mechanism 32 has a temperature sensor 551 for measuring the temperature of the cooling target region R1 in the cooling target region R1, a temperature sensor 552 for measuring the temperature of the cooling target region R2 in the cooling target region R2, and a temperature sensor 553 for measuring the temperature of the cooling target region R3 in the cooling target region R3. The measurement results by the temperature sensors 551 to 553 are output to the controller 51.

<Method of Cooling Arm>

In the present embodiment, the controller 51 determines the distribution ratio of the compressed gas from the compressed gas source 501 for each of the plurality of cooling target regions R. Specifically, the controller 51 determines the distribution ratio based on the following thermal index P. The thermal index P is calculated for each of the cooling target regions R1 to R3 based on:

(1) the change amount of $\Delta T_n$ of a temperature $T_n$ measured by the temperature sensor 551 or the like from a reference temperature $T_0$ in a cooling target region Rn (n is any one of 1, 2, and 3), and (2) the influence degree $\alpha_n$ of the temperature of the cooling target region Rn affecting the movement accuracy of the fork 301.

The reference temperature $T_0$ is a temperature at which the wafer transfer mechanism 32 is assembled, for example, the room temperature.

Figure 3:
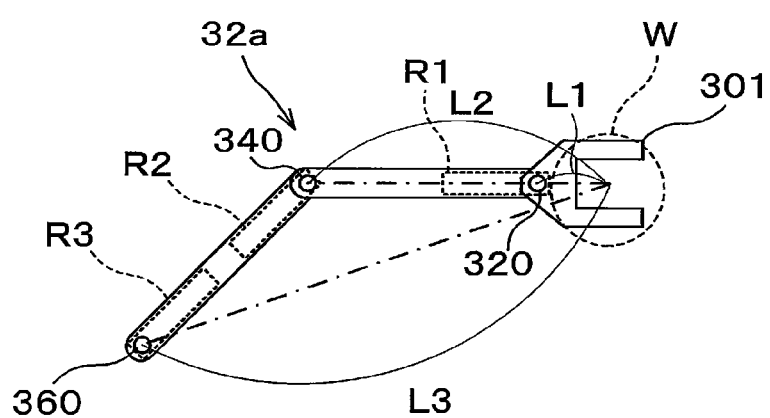
FIG. 3 is a view for explaining the degree of influence an of the temperature of a cooling target region on the movement accuracy of a fork.

FIG. 3 is a view for explaining the above-mentioned influence degree $\alpha_n$. The figure shows a state in which the transfer arm 32a is most extended in the wafer processing system 1. In such a state where the transfer arm 32a is most extended, the movement accuracy of the fork 301 (that is, the transfer accuracy of the wafer W) by the arm 302 becomes the worst. When the cooling target region Rn has high temperature and an abnormality occurs in the gear or the like of the drive mechanism of the cooling target region Rn, the cooling target region R3, which may be located farthest from the fork 301, has the greatest effect on the movement accuracy of the fork 301. On the other hand, the cooling target region R1, which may be located closest to the fork 301, has the least influence. In the state where the transfer arm 32a is most extended, the cooling target region R2 is farther than the cooling target region R1 from the fork 301 and closer to the fork 301 than the cooling target region R3. Therefore, the degree of influence of the cooling target region R2 on the movement accuracy of the fork 301 is larger than that of the cooling target region R1 and smaller than that of the cooling target region R3.

Therefore, in the present embodiment, the influence degree αn of the cooling target region Rn is set in advance based on, for example, a distance Ln from the fork 301 to the cooling target region Rn in the state where the transfer arm 32a is most extended in the wafer processing system 1.

The influence degree α1 of the cooling target region R1 is set in advance based on, for example, a distance L1 from the fork 301 (specifically, the design position of the center of the wafer W mounted on the fork 301) in the state where the transfer arm 32a is most extended in the wafer processing system 1, to the cooling target region R1 (specifically, the central axis of the shaft portion 320 which is the joint shaft corresponding to the cooling target region R1). The influence degree α2 of the cooling target region R2 is set in advance based on, for example, a distance L2 from the fork 301 (specifically, the design position of the center of the wafer W mounted on the fork 301) in the state where the transfer arm 32a is most extended in the wafer processing system 1, to the cooling target region R2 (specifically, the central axis of the shaft portion 340 which is the joint shaft corresponding to the cooling target region R2). The influence degree α3 of the cooling target region R3 is set in advance based on, for example, a distance L3 from the fork 301 (specifically, the design position of the center of the wafer W mounted on the fork 301) in the state where the transfer arm 32a is most extended in the wafer processing system 1, to the cooling target region R3 (specifically, the central axis of the elevating shaft 360 which is the joint shaft corresponding to the cooling target region R3).

More specifically, the above-mentioned influence degrees α1 to α3 of the cooling target regions R1 to R3 are set in advance as follows, for example.

$$\alpha 1 = L1/L1 = 1$$

$$\alpha 2 = L2/L1$$

$$\alpha 3 = L3/L1$$

The controller 51 calculates a thermal index Pn of the cooling target region Rn based on the change amount ΔTn of the measured temperature Tn of the cooling target region Rn from the reference temperature $T_0$ and the influence degree αn of the cooling target region Rn.

For example, the thermal index Pn is calculated based on the following formula.

$$Pn = \alpha n \times \Delta Tn$$

Then, as described above, the controller 51 determines the distribution ratio of the compressed gas from the compressed gas source 501 for each of the cooling target regions R1 to R3 based on the thermal index Pn. Specifically, the controller 51 determines the distribution ratio so that the compressed gas is preferentially supplied to the cooling target region Rn having the highest thermal index Pn. More specifically, the controller 51 determines the distribution ratio so that, for example, the thermal index Pn becomes equal among the cooling target regions Rn. More specifically, the controller 51 stores in advance a table in which thermal indexes P1 to P3 of the respective cooling target regions R1 to R3 are associated with the distribution ratios, in the storage part (not shown), and determines the distribution ratio based on the calculated thermal index Pn and the table.

With the distribution ratio determined in this way, the cooler 500 distributes and supplies the compressed gas from the compressed gas source 501, thereby cooling the arm 302.

Further, for each of the cooling target regions R1 to R3, the controller 51 may determine whether or not the temperature Tn measured by the temperature sensor 551 or the like of the cooling target region Rn is lower than a threshold value X determined based on an allowable temperature Tp of the cooling target region R (for example, 80% of the allowable temperature). The allowable temperature Tp is determined based on the heat resistant temperature of a member located in the cooling target region Rn and a member facing the cooling target region Rn (specifically, the heat resistant temperature of the seal mechanisms 330, 350, and 370). Further, the allowable temperature Tp is determined based on the upper limit of the guaranteed operating temperature of the gear units 412, 422, and 432. The allowable temperature Tp and the threshold value X based on the allowable temperature Tp may be different for each cooling target region R.

Then, the form of supply of the compressed gas from the cooler 500 may be changed according to the determination result of the threshold value X based on the allowable temperature Tp. For example, for all of the cooling target regions R1 to R3, when the measured temperature Tn is lower than the threshold value X determined based on the allowable temperature Tp of the cooling target region Rn, the cooler 500 distributes and supplies the compressed gas at the distribution ratio determined as described above. Further, for example, when the measured temperature of only some cooling target region R is higher than the threshold value X, the cooler 500 preferentially supplies the compressed gas to some cooling target region R, that is, a high temperature cooling target region R.

<Specific Example of Cooling Process of Arm 302>

Figure 4:
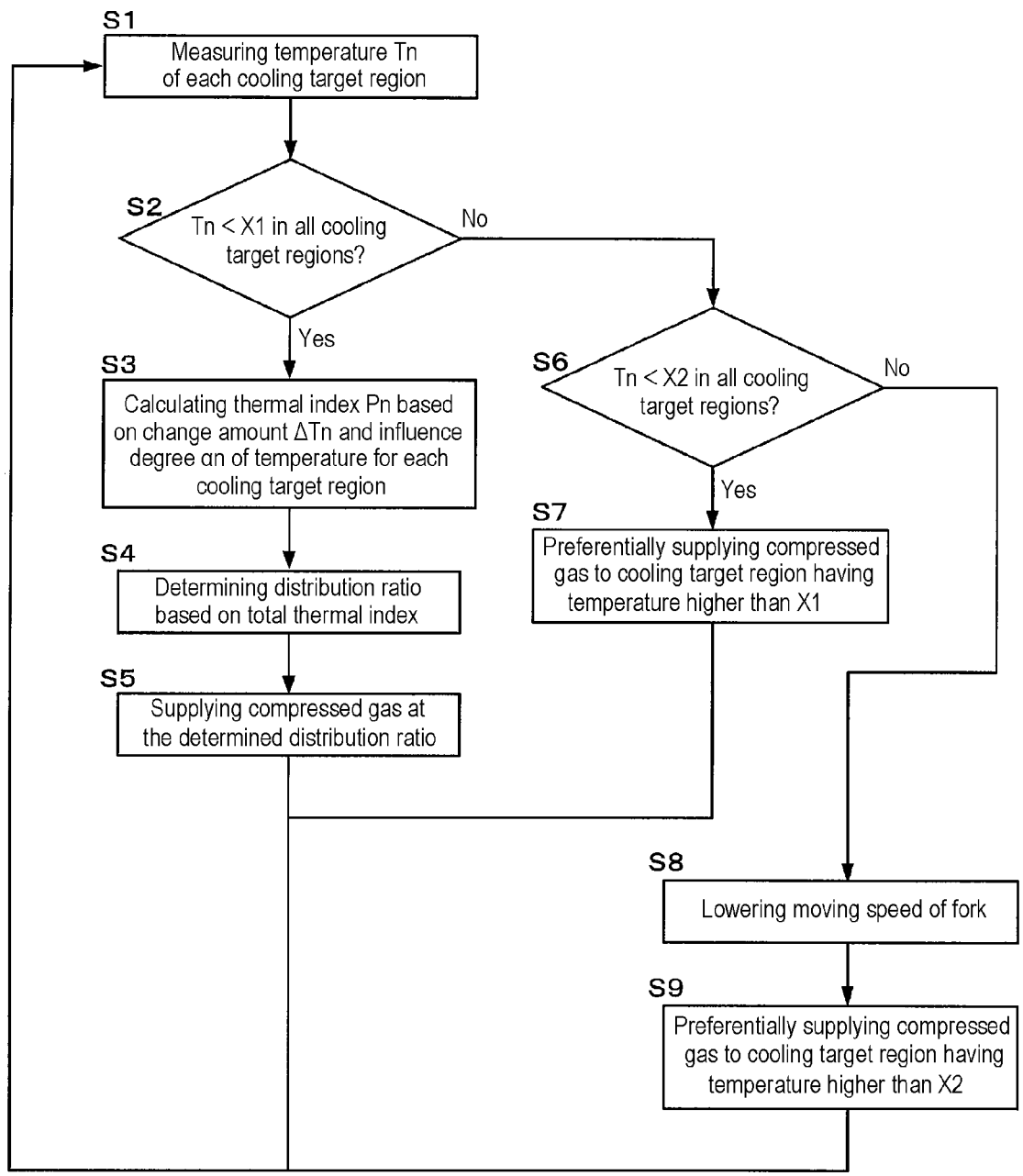
FIG. 4 is a flowchart for explaining a specific example of an arm cooling process.

Next, a more specific example of the cooling process of the arm 302 will be described. FIG. 4 is a flowchart for explaining a specific example of the cooling process of the arm 302.

Step S1

First, under the control of the controller 51, the temperatures T1 to T3 of the cooling target regions R1 to R3 of the arm 302 are measured by the temperature sensors 551 to 553, respectively. This temperature measurement is performed at a predetermined timing, for example, every time a predetermined time elapses.

Step S2

Next, the controller 51 determines whether or not the temperature Tn of the cooling target region Rn in all the cooling target regions R1 to R3 is lower than a first threshold value X1 determined based on the allowable temperature Tp (for example, 80% of the allowable temperature).

Step S3

When it is determined in step S2 that the temperature Tn in all the cooling target regions R1 to R3 is lower than the first threshold value X1 ("YES" in step S2), the controller 51 calculates the thermal index Pn as follows. That is, for each of the cooling target regions R1 to R3, the controller 51 calculates the thermal index Pn based on the change amount ΔTn of the measured temperature Tn of the cooling target region Rn from the reference temperature $T_0$ and the influence degree αn of the temperature of the cooling target region Rn affecting the movement accuracy of the fork 301.

Step S4

Next, the controller 51 determines the distribution ratio of the compressed gas from the compressed gas source 501 in the cooler 500 based on the thermal index Pn calculated for each of the cooling target regions R1 to R3, that is, based on the total thermal index of the thermal indexes P1, P2, and P3.

Step S5

Then, under the control of the controller 51, the cooler 500 distributes and supplies the compressed gas from the compressed gas source 501 to each of the cooling target regions R1 to R3 based on the determined distribution ratio. Specifically, the controller 51 controls the flow rate adjusting device groups 531 to 533 so that the compressed gas from the compressed gas source 501 is supplied to the cooling target regions R1 to R3 at the determined distribution ratio. After that, the process is returned to step S1.

If the temperature Tn in all the cooling target regions R1 to R3 is sufficiently so low not to require the cooling, the controller 51 may control the opening/closing valve 540 to stop the supply of the compressed gas from the compressed gas source 501 to the cooling target regions R1 to R3. Further, a flow rate adjusting valve may be provided in the main pipe 520, and when the temperature Tn in all the cooling target regions R1 to R3 is relatively so low to be close to the above-mentioned reference temperature $T_0$, the controller 51 may control the flow rate adjusting valve provided in the main pipe 520 to reduce the total flow rate of the compressed gas supplied from the compressed gas source 501 to the distribution pipes 511 to 513.

Step S6

Further, when it is determined in step S2 that the temperature Tn in any one of the cooling target regions R1 to R3 is equal to or higher than the first threshold value X1 ("NO" in step S2), the controller 51 determines whether or not the temperature Tn of the cooling target region Rn in all the cooling target regions R1 to R3 is lower than a second threshold value (for example, 90% of the allowable temperature) X2 which is larger than the first threshold value X1.

Step S7

When it is determined in step S6 that the temperature Tn in all the cooling target regions R1 to R3 is lower than the second threshold value X2 ("YES" in step S6), the cooler 500 preferentially supplies the compressed gas from the compressed gas source 501 to a cooling target region Rn having a temperature Tn which is equal to or higher than the first threshold value X1 and lower than the second threshold value X2. Specifically, for example, the controller 51 controls the flow rate adjusting device groups 521 to 523 so that the compressed gas is supplied from the compressed gas source 501 only to the cooling target region Rn having the temperature Tn which is equal to or higher than the first threshold value X1 and lower than the second threshold value X2. Further, when the temperature Tn in all the cooling target regions Rn is equal to or higher than the first threshold value X1 and lower than the second threshold value X2, for example, the same process as in steps S3 to S5 is performed. After that, the process is returned to step S1.

Step S8

Further, when it is determined in step S6 that the temperature Tn in any one of the cooling target regions Rn is equal to or higher than the second threshold value X2 ("NO" in step S6), that is, when the temperature of the transfer arm 32a (specifically, the internal temperature of the arm 302) is too high, the controller 51 makes the moving speed of the fork 301 by the arm 302 lower than the normal speed. Specifically, for example, the controller 51 makes the upper limit of the moving speed of the fork 301 uniformly lower from the upper limit of the normal speed. The normal speed is, for example, the moving speed of the fork 301 when it is determined in step S2 that the temperature Tn in all the cooling target regions R1 to R3 is lower than the first threshold value X1. As a result, it is possible to suppress heat generation from the motors 411, 421, and 431 of the drive mechanisms 401 to 403.

Step S9

In addition to the lowering in the moving speed of the fork 301 by the controller 51, under the control of the controller 51, the cooler 500 preferentially supplies the compressed gas from the compressed gas source 501 to a cooling target region Rn having a temperature Tn which is equal to higher than the second threshold value X2. Specifically, for example, the controller 51 controls the flow rate adjusting device groups 521 to 523 so that the compressed gas is supplied from the compressed gas source 501 only to the cooling target region Rn having the temperature Tn which is equal to or higher than the second threshold value X2. When the temperature Tn in all the cooling target regions Rn is equal to or higher than the second threshold value X2, for example, the entire operation of the wafer transfer mechanism 32 are stopped. After that, the process is returned to step S1.

Main Effects of the Present Embodiment

As described above, in the present embodiment, for each of the cooling target regions R1 to R3, the controller 51 calculates the thermal index Pn based on the change amount ΔTn of the measured temperature Tn of the cooling target region Rn from the reference temperature $T_0$ and the influence degree an of the temperature of the cooling target region Rn affecting the movement accuracy of the fork 301. Further, the controller 51 determines the distribution ratio of the compressed gas from the compressed gas source 501 in the cooler 500 based on the thermal index Pn calculated for each of the cooling target regions R1 to R3. Therefore, even if the supply amount of the compressed gas from the compressed gas source 501 is limited for energy saving, the arm 302 can be efficiently cooled so that the movement accuracy of the fork 301 does not deteriorate.

Further, in the present embodiment, when the measured temperature Tn of any one of the cooling target regions R1 to R3 is equal to or higher than the first threshold value X1 and less than the second threshold value X2, both of which are determined based on the allowable temperature Tp, the compressed gas from the compressed gas source 501 is not supplied at the distribution ratio determined as described above, but is preferentially supplied to the cooling target region Rn of X1≤Tn<X2. Therefore, it is possible to more reliably prevent the temperature of the cooling target regions R1 to R3 from exceeding the allowable temperature Tp. As a result, it is possible to more reliably prevent the vacuum in the vacuum transfer chamber 31 from being broken due to an abnormality occurring in the resin seal members of the seal mechanisms 330 and 350 or prevent the wafer W from dropping from the transfer arm 32a due to a malfunction occurring in the gear unit 412 of the drive mechanism 401.

Further, in the present embodiment, when the measured temperature Tn of any one of the cooling target regions R1 to R3 is equal to or higher than the second threshold value X2, the controller 51 makes the moving speed of the fork 301 lower than the normal speed so that the heat generated from the motors 411, 421 and 431 is suppressed. Therefore, by supplying the compressed gas to the cooling target region Rn having the temperature Tn which is equal to or higher than the second threshold value X2, it is possible to more reliably suppress the temperature of the cooling target regions R1 to R3 from exceeding the allowable temperature Tp.

Modifications of Step S8

In the above example, when the temperature Tn in any one of the cooling target regions Rn is equal to or higher than the second threshold value X2, that is, when the internal temperature of the arm 302 is too high, the controller 51 makes the moving speed of the fork 301 uniformly lower than the normal speed. Instead of this, when the internal temperature of the arm 302 is too high, the controller 51 may set the moving speed of the fork 301 to the normal speed in a specific case. In other cases, the controller 51 may make the moving speed of the fork 301 lower than the normal speed in other cases. The above "specific case" refers to, for example, a case when the fork 301 supports the wafer W having a temperature higher than a predetermined temperature (for example, 50 degrees C.), or a case when the fork 301 is moved forward or backward with respect to a transfer destination whose inside has a temperature higher than the predetermined temperature (for example, 50 degrees C.), that is, any one of the processing apparatuses 40 to 43 that process the wafer W at a high temperature. The above "other cases" refers to, for example, a case when the fork 301 supports the wafer W having a temperature equal to or lower than the predetermined temperature, or a case when the fork 301 is moving toward a position where the fork 301 is moved forward or backward with respect to the high temperature transfer destination.

Further, when the internal temperature of the arm 302 is too high, the controller 51 may stop the fork 301 for a predetermined time (for example, 5 to 10 seconds or more) for each series of operations.

When the internal temperature of the arm 302 is too high, the fork 301 may be brought into a thermally advantageous state, and then the movement of the fork 301 may be stopped.

The "thermally advantageous state" refers to, for example, a state in which the transfer arm 32a is folded and the fork 301 is separated from the processing apparatuses 40 to 43 whose inside has a high temperature, which are the transfer destinations or transfer sources of the wafer W.

Further, the "thermally advantageous state" may refer to, when the wafer W having a temperature higher than a predetermined temperature is supported by the fork 301, a state in which the high temperature wafer W is delivered to a transfer destination such as the load lock device 12 and then the fork 301 is retracted from the transfer destination.

Figure 5:
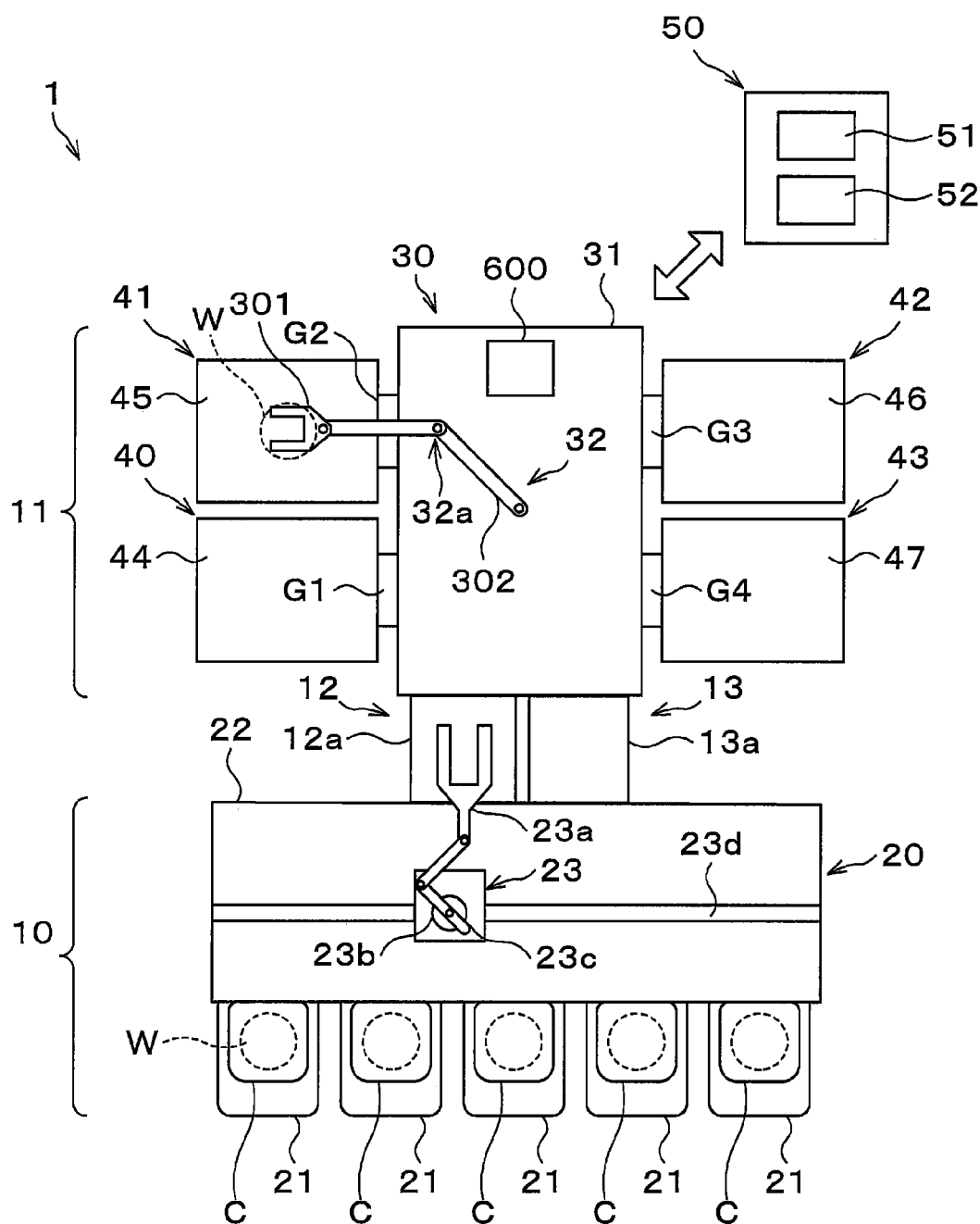
FIG. 5 is a plane view schematically showing another example of the configuration of the vacuum transfer device.

The "thermally advantageous state" may refer to, when a cooler 600 cooled by a cooling medium is provided in the vacuum transfer chamber 31 as shown in FIG. 5, a state in which the arm 302 faces the cooler 600. Further, in the case of a cryopump, which condenses and adsorbs gas molecules on an extremely low temperature surface, is used as an exhaust device for exhausting the interior of the vacuum transfer chamber 31, the "thermally advantageous state" may refer to a state in which an exhaust port provided with the cryopump faces the arm 302. In this case, the cooler 600 may be omitted.

Further, when the movement of the fork 301 is stopped after the fork 301 is brought into the thermally advantageous state, the movement of the fork 301 does not have to be stopped immediately. For example, when a threshold value Y1 (for example, X2=Y1) is exceeded and a threshold value Y2 is not exceeded, the movement of the fork 301 may be stopped after all the processing for a lot currently being processed is completed. When the threshold value Y2 is exceeded and a threshold value Y3 is not exceeded, the movement of the fork 301 may be stopped without loading an unprocessed wafer W after being unloaded from the processing station 11. When the threshold value Y3 is exceeded, the movement of the fork 301 may be stopped immediately.

<Modifications of Transfer Arm>

Figure 6:
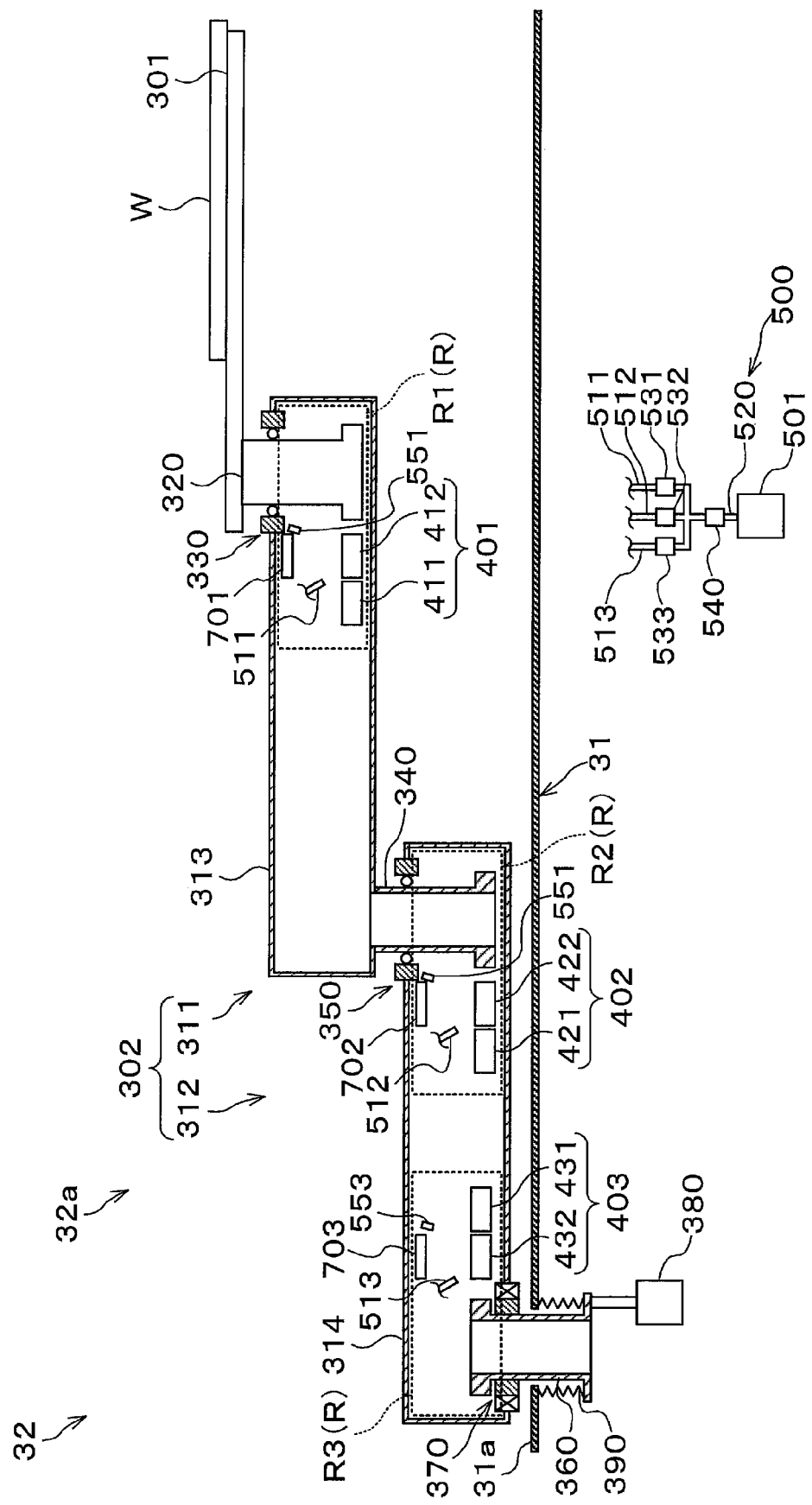
FIG. 6 is a longitudinal sectional view schematically showing another example of the configuration of the wafer transfer mechanism.

FIG. 6 is a longitudinal sectional view schematically showing another example of the configuration of the wafer transfer mechanism 32. Unlike the one in FIG. 2, the wafer transfer mechanism 32 of FIG. 6 is provided with a fan 701 that sends out cooling air toward the drive mechanism 401 in the cooling target region R1, a fan 702 that sends out cooling air toward the drive mechanism 402 in the cooling target region R2, and a fan 703 that sends out cooling air toward the drive mechanism 403 in the cooling target region R3. A gas around the drive mechanisms 401 to 403 can be agitated by the fans 701 to 703, resulting in improved heat exchange efficiency between the compressed air supplied from the distribution pipes 511 to 513 and the drive mechanisms 401 to 403. Further, air around the drive mechanisms 401 to 403 warmed by the heat exchange can be sent out by the fans 701 to 703. Therefore, by providing the fans 701 to 703, it is possible to further prevent the deterioration of the movement accuracy of the fork 301, that is, the transfer accuracy of the wafer W by the wafer transfer mechanism 32.

In the above example, the technique according to the present disclosure is applied to the vacuum transfer device 30, but it may be applied to the atmospheric pressure transfer device 20.

The embodiments disclosed this time should be considered to be exemplary and not restrictive in all respects. The above embodiments may be omitted, replaced, or changed in various forms without departing from the appended claims and the gist thereof.

According to the present disclosure in some embodiments, it is possible to efficiently cool an arm in a substrate transfer device to prevent a decrease in the movement accuracy of a substrate support.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer device that transfers a substrate, comprising:

a transfer arm including a substrate support that supports the substrate, and an arm that is connected to the substrate support and moves the substrate support;

a cooler configured to distribute and supply a cooling fluid from a fluid supply source to each of a plurality of cooling target regions of the arm;

a measuring part configured to measure a temperature of each of the cooling target regions; and a controller configured to:
calculate a thermal index for each of the cooling target regions based on an amount of change of the temperature of each of the cooling target regions measured by the measuring part from a reference temperature and a degree of influence of the temperature of each of the cooling target regions;

determine a distribution ratio of the cooling fluid from the fluid supply source by the cooler based on the thermal index; and control the cooler to distribute the cooling fluid from the fluid supply source at the distribution ratio determined based on the thermal index, wherein the degree of influence is a predetermined value for each of the cooling target regions, the predetermined value being proportional to a distance from the substrate support to each of the cooling target regions.

2. The substrate transfer device of claim 1, wherein the transfer arm is an articulated arm and includes a drive mechanism that drives a relative rotation between portions connected via a joint shaft of the articulated arm, wherein the drive mechanism is included in each of the cooling target regions, and wherein the predetermined value is determined based on a distance from the joint shaft driven by the drive mechanism included in the cooling target region to the substrate support.

3. The substrate transfer device of claim 2, wherein the controller determines the distribution ratio so that the thermal index becomes equal among the cooling target regions.

4. The substrate transfer device of claim 3, wherein the controller is further configured to:

control the cooler to distribute the cooling fluid from the fluid supply source at the distribution ratio determined based on the thermal index when the temperature of all the cooling target regions measured by the measuring part is lower than a threshold value determined based on an allowable temperature of each of the cooling target regions; and control the cooler to supply the cooling fluid from the fluid supply source to only some of the cooling target regions when the temperature of the some of the cooling target regions measured by the measuring part is higher than the threshold value.

5. The substrate transfer device of claim 4, wherein when the temperature of at least one of the cooling target regions measured by the measuring part is higher than another threshold value larger than the threshold value, the controller makes a moving speed of the substrate support lower than a normal speed which is a speed when the temperature measured by the measuring part is lower than the threshold value.

6. The substrate transfer device of claim 5, wherein when the temperature of at least one of the cooling target regions measured by the measuring part is higher than the another threshold value larger than the threshold value, the controller stops the substrate support for a predetermined time.

7. The substrate transfer device of claim 6, wherein the drive mechanism drives bending and stretching of the articulated arm, and wherein the transfer arm includes a fan that sends out a cooling medium toward the drive mechanism.

8. The substrate transfer device of claim 4, wherein when the temperature of at least one of the cooling target regions measured by the measuring part is higher than another threshold value larger than the threshold value, the controller brings the substrate support into a state in which the substrate support is separated from a transfer destination or transfer source of the substrate and then stops the movement of the substrate support.

9. The substrate transfer device of claim 8,
wherein the substrate support is separated from the transfer destination or the transfer source of the substrate by folding the articulated arm.

10. The substrate transfer device of claim 4, further comprising: an additional cooler cooled by a cooling medium, wherein when the temperature of at least one of the cooling target regions measured by the measuring part is higher than another threshold value larger than the threshold value, the controller brings the substrate support into a state in which the arm faces the additional cooler.

11. The substrate transfer device of claim 5, wherein the controller sets the moving speed of the substrate support to the normal speed in predetermined cases including when the temperature of at least one of the cooling target regions measured by the measuring part is higher than the another threshold value larger than the threshold value, when the substrate support supports the substrate having a temperature higher than a predetermined temperature, or when the substrate support is moved forward or backward with respect to a transfer destination whose internal temperature is higher than a predetermined temperature, and wherein the controller makes the moving speed of the substrate support lower than the normal speed in cases other than the predetermined cases.

12. The substrate transfer device of claim 4, wherein when the temperature of at least one of the cooling target regions measured by the measuring part is higher than another threshold value larger than the threshold value, the controller stops the substrate support for a predetermined time for each series of operations.

13. The substrate transfer device of claim 1, wherein the transfer arm is an articulated arm and includes a drive mechanism that drives bending and stretching of the articulated arm and a fan that sends out a cooling medium toward the drive mechanism.

14. The substrate transfer device of claim 1, wherein the controller determines the distribution ratio so that the thermal index becomes equal among the cooling target regions.

15. The substrate transfer device of claim 1, wherein the cooler distributes the cooling fluid from the fluid supply source at the distribution ratio determined based on the thermal index when the temperature of all the cooling target regions measured by the measuring part is lower than a threshold value determined based on an allowable temperature of each of the cooling target regions, and wherein the cooler supplies the cooling fluid from the fluid supply source to only some of the cooling target regions when the temperature of the some of the cooling target regions measured by the measuring part is higher than the threshold value.

16. A method of cooling an arm of a substrate transfer device that transfers a substrate, the substrate transfer device including a transfer arm including a substrate support that supports the substrate, and an arm that is connected to the substrate support and moves the substrate support, the method comprising:
- measuring a temperature of each of cooling target regions of the arm;
- calculating a thermal index for each of the cooling target regions based on an amount of change of the measured temperature of each of the cooling target regions from a reference temperature and a degree of influence of the temperature of each of the cooling target regions;
- determining a distribution ratio of a cooling fluid from a fluid supply source for each of the cooling target regions based on the thermal index; and
- distributing and supplying the cooling fluid from the fluid supply source to each of the cooling target regions based on the determined distribution ratio,
- wherein the degree of influence is a predetermined value for each of the cooling target regions, the predetermined value being proportional to a distance from the substrate support to each of the cooling target regions.

* * * * *